(12) United States Patent
Nakagawa

(10) Patent No.: US 10,847,306 B2
(45) Date of Patent: Nov. 24, 2020

(54) HIGH-FREQUENCY MODULE

(71) Applicant: Murata Manufacturing Co., Ltd., Kyoto (JP)

(72) Inventor: Dai Nakagawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/665,165

(22) Filed: Oct. 28, 2019

(65) Prior Publication Data

US 2020/0058436 A1 Feb. 20, 2020

Related U.S. Application Data

(63) Continuation of application No. PCT/JP2018/020647, filed on May 30, 2018.

(30) Foreign Application Priority Data

Jun. 8, 2017 (JP) .................. 2017-113338

(51) Int. Cl.
*H01F 27/28* (2006.01)
*H03F 3/21* (2006.01)
(Continued)

(52) U.S. Cl.
CPC ........... *H01F 27/2804* (2013.01); *H03F 3/21* (2013.01); *H03H 7/38* (2013.01); *H03H 7/463* (2013.01); *H04B 1/50* (2013.01)

(58) Field of Classification Search
CPC combination set(s) only.
See application file for complete search history.

(56) References Cited

U.S. PATENT DOCUMENTS

2004/0217915 A1 11/2004 Imaizumi
2010/0148886 A1* 6/2010 Inoue ................... H03H 9/6483
333/132

(Continued)

FOREIGN PATENT DOCUMENTS

JP 2004-336250 A 11/2004
JP 2007-124202 A 5/2007

(Continued)

OTHER PUBLICATIONS

International Search Report for International Application No. PCT/JP2018/020647, dated Aug. 21, 2018.

(Continued)

*Primary Examiner* — Ganiyu A Hanidu
(74) *Attorney, Agent, or Firm* — Pearne & Gordon LLP

(57) ABSTRACT

A front-end circuit (1), which is a high-frequency module, includes an input-output terminal (4); a duplexer (14) electrically connected to the input-output terminal (4); an LNA (171) electrically connected to the duplexer (14); a PA (161) electrically connected to the duplexer (14); a matching network (23) provided between the input-output terminal (4) and the duplexer (14) and including an inductor (231); and a matching network provided between the duplexer (14) and the PA (161) and including an inductor (162). The matching network including the inductor (162) is an output matching network configured to perform impedance matching between an output terminal of the PA (161) and the duplexer (14), and the inductor (231) includes a plurality of inductors (231a and 231b) connected in series.

20 Claims, 4 Drawing Sheets

(51) Int. Cl.
*H03H 7/38* (2006.01)
*H03H 7/46* (2006.01)
*H04B 1/50* (2006.01)

(56) References Cited

U.S. PATENT DOCUMENTS

| | | |
|---|---|---|
| 2011/0215981 A1 | 9/2011 | Kim et al. |
| 2011/0279177 A1 | 11/2011 | Furutani et al. |
| 2013/0063223 A1* | 3/2013 | See .................. H03F 1/56 |
| | | 333/32 |
| 2014/0112213 A1* | 4/2014 | Norholm ............ H04B 1/006 |
| | | 370/277 |
| 2014/0225680 A1* | 8/2014 | Fujiwara ............ H03F 3/189 |
| | | 333/133 |
| 2016/0028156 A1 | 1/2016 | Fujiwara et al. |
| 2017/0222617 A1* | 8/2017 | Mizoguchi .......... H03H 9/0009 |
| 2018/0034423 A1* | 2/2018 | Yanagihara .......... H03F 3/213 |

FOREIGN PATENT DOCUMENTS

| | | |
|---|---|---|
| JP | 2011-019004 A | 1/2011 |
| JP | 2011-182403 A | 9/2011 |
| WO | 2010/087305 A1 | 8/2010 |
| WO | 2013/080428 A1 | 6/2013 |

OTHER PUBLICATIONS

Written Opinion for International Application No. PCT/JP2018/020647, dated Aug. 21, 2018.

\* cited by examiner

HIGH-FREQUENCY MODULE

This is a continuation of International Application No. PCT/JP2018/020647 filed on May 30, 2018 which claims priority from Japanese Patent Application No. 2017-113338 filed on Jun. 8, 2017. The contents of these applications are incorporated herein by reference in their entireties.

BACKGROUND OF THE DISCLOSURE

Field of the Disclosure

The present disclosure relates to a high-frequency module.

Description of the Related Art

In the related art, in a high-frequency module using high-frequency components, such as a duplexer, a power amplifier, and a high-frequency filter, the high-frequency components are produced as separate components and are discretely mounted on a surface of a substrate. In this case, the high-frequency module increases in size, and the cost thereof also increases. Thus, in a recent high-frequency module, some components of these high-frequency components are built into a substrate, and the remaining components are mounted on a surface of the substrate, thereby promoting miniaturization (see Patent Document 1, for example).

In a high-frequency module disclosed in Patent Document 1, a semiconductor element for power amplification, which is a power amplifier, and a duplexer are mounted on a surface of a substrate. Furthermore, an output matching network is disposed that adjusts the impedance between an output terminal of the semiconductor element for power amplification and the duplexer.

Patent Document 1: Japanese Unexamined Patent Application Publication No. 2007-124202

BRIEF SUMMARY OF THE DISCLOSURE

However, as high integration and miniaturization of a high-frequency module proceed, the number of components that are mounted on a surface of a substrate of the high-frequency module, and the numbers of elements, wiring patterns, and so forth that are formed within the substrate increase, and signal interference occurs between wiring patterns, between a wiring pattern and a component, or between components. In particular, since a transmission-side power amplifier circuit deals with a high-frequency transmission signal with higher power than that in a reception-side circuit, it is assumed that the high-frequency transmission signal, a harmonic component of the high-frequency transmission signal, or an intermodulation distortion component generated between the high-frequency transmission signal and another high-frequency signal causes electromagnetic field coupling between circuits that are disposed before and after a duplexer and include an output matching network. In this case, the high-frequency transmission signal, a harmonic component of the high-frequency transmission signal, or an intermodulation distortion component generated between the high-frequency transmission signal and another high-frequency signal bypasses the duplexer and leaks to a reception circuit, thereby reducing the reception sensitivity of the high-frequency module.

In view of the above-described issues, the present disclosure aims to provide a high-frequency module that reduces the leakage of a high-frequency transmission signal from a power amplifier circuit to a reception circuit and is excellent in reception sensitivity.

To achieve the above-described aim, an aspect of a high-frequency module according to the present disclosure includes an antenna terminal; a branching circuit electrically connected to the antenna terminal; a reception circuit electrically connected to the branching circuit; a transmission circuit electrically connected to the branching circuit and including a power amplifier circuit; a first matching network provided between the antenna terminal and the branching circuit and including a first inductor; and a second matching network provided between the branching circuit and the power amplifier circuit and including a second inductor. The second matching network is an output matching network configured to perform impedance matching between an output terminal of the power amplifier circuit and the branching circuit, and the first inductor includes a plurality of inductors connected in series.

Thus, the degree of electromagnetic field coupling between the first inductor constituted by two or more individual inductors in which the number of turns of a winding, a distance between turns of the winding, a winding direction, and so forth are not standardized and the second inductor can be reduced in comparison with the degree of electromagnetic field coupling with the second inductor in the case where the first inductor is constituted by one inductor in which the number of turns of a winding, a distance between turns of the winding, a winding direction, and so forth are standardized. Hence, a high-frequency transmission signal having leaked from the power amplifier circuit bypasses the branching circuit through the first inductor and propagates into the reception circuit, thereby making it possible to suppress an increase in noise level in the reception circuit. Thus, the reception sensitivity of the high-frequency module can be increased.

Furthermore, the first inductor and the second inductor may be coupled via an electromagnetic field.

On this basis, even if the first inductor and the second inductor are disposed so that they are coupled via an electromagnetic field, the degree of electromagnetic field coupling between the first inductor constituted by two or more individual inductors and the second inductor can be reduced in comparison with the degree of electromagnetic field coupling with the second inductor in the case where the first inductor is constituted by one inductor. Thus, the reception sensitivity of the high-frequency module can be increased.

Furthermore, the branching circuit may be connected to a plurality of signal paths for transmitting and receiving high-frequency signals in a plurality of communication bands, the high-frequency module may include a switch configured to switch between the plurality of signal paths, and the first matching network may be connected between the switch and the branching circuit and may perform impedance matching between the switch and the branching circuit.

Thus, the first matching network and the second matching network that are disposed in proximity to each other with the branching circuit interposed therebetween are inhibited from being coupled via an electromagnetic field, thereby making it possible to effectively suppress a reduction in reception sensitivity in the reception circuit.

Furthermore, the first inductor may be connected between a node between the antenna terminal and the branching circuit and a ground.

Thus, in the first matching network, the first inductor is connected between the node between the antenna terminal and the branching circuit and the ground, therefore making it possible to reduce the loss due to impedance matching in comparison with the case where the first inductor is connected in series with the antenna terminal.

Furthermore, at least two of the plurality of inductors may be disposed on the substrate so that directions of axes of at least two of the plurality of inductors intersect each other when viewed in plan.

A direction of an axis of an inductor refers to a direction in which a central axis of a coil formed as the inductor extends. In this configuration, directions of axes of two inductors constituting the first inductor intersect each other, and thus the sum of the amount of coupling between one inductor of the two inductors and the second inductor and the amount of coupling between the other inductor of the two inductors and the second inductor can be reduced in comparison with the amount of electromagnetic field coupling between the first inductor constituted by one inductor in which the number of turns of a winding, a distance between turns of the winding, a winding direction and so forth are standardized and the second inductor. That is, when a combined inductance value of the two inductors directions of axes of which intersect each other is set to the same inductance value as that of the first inductor constituted by one inductor, the effective amount of electromagnetic field coupling between the two inductors and the second inductor can be reduced in comparison with the amount of electromagnetic field coupling between the one inductor and the second inductor. Thus, a high-frequency transmission signal having leaked from the power amplifier circuit can be inhibited from propagating into the branching circuit through the first inductor and having an effect on a reception signal. Hence, the reception sensitivity of the high-frequency module can be increased.

Furthermore, at least two of the plurality of inductors may be disposed on the substrate so that directions of axes of at least two of the plurality of inductors intersect each other at right angles when viewed in plan.

In this configuration, directions of axes of two inductors intersect each other at right angles, and thus an effective combined inductance value of the two inductors becomes smaller than that of one inductor having an inductance value obtained by simply adding inductance values of the two inductors. Thus, a high-frequency transmission signal having leaked from the power amplifier circuit can be inhibited from propagating into the branching circuit through the first inductor and having an effect on a reception signal. Hence, the reception sensitivity of the high-frequency module can be increased.

Furthermore, one inductor of the plurality of inductors may be a chip inductor, and another inductor of the plurality of inductors may be built into a substrate.

Thus, the first inductor is constituted by a chip inductor surface-mounted on the substrate, and an inductor built into the substrate. Hence, the sum of the amount of coupling between one inductor of these two inductors and the second inductor and the amount of coupling between the other inductor of the two inductors and the second inductor can be reduced in comparison with the amount of electromagnetic field coupling between the first inductor constituted by one inductor in which a Q value, the number of turns of a winding, a distance between turns of the winding, a winding direction, and so forth are standardized and the second inductor. That is, when a combined inductance value of the above-described two inductors is set to the same inductance value as that of the first inductor constituted by one inductor, the effective amount of electromagnetic field coupling between the two inductors and the second inductor can be reduced in comparison with the amount of electromagnetic field coupling between the first inductor constituted by one inductor and the second inductor. In other words, the sum of the amounts of leakage of a harmonic component of a high-frequency transmission signal from the second inductor to the above-described respective two inductors is reduced in comparison with the case where the first inductor is constituted by one inductor. Thus, a high-frequency transmission signal having leaked from the power amplifier circuit propagates into the reception circuit through the second inductor and the first inductor, thereby making it possible to suppress an increase in noise level of a reception signal. Hence, the reception sensitivity of the high-frequency module can be increased. Furthermore, since the other inductor constituting the first inductor is a substrate built-in type inductor, the numbers of components and lines that are disposed on the substrate can be reduced, and the high-frequency module can thus be miniaturized. Furthermore, high-frequency signal interference is inhibited from occurring between wiring patterns, and the reception sensitivity of the high-frequency module can be increased further.

Furthermore, of the plurality of inductors, an inductance value of an inductor disposed closest to the second inductor may be smaller than an inductance value of at least one inductor of the plurality of inductors other than the inductor disposed closest to the second inductor.

Of the plurality of inductors, an inductor disposed close to the second inductor is more susceptible to the propagation of a harmonic component of a high-frequency transmission signal having leaked from the power amplifier circuit than an inductor disposed away from the second inductor. Hence, when, of the plurality of inductors, an inductance value of an inductor disposed closest to the second inductor is set to be smaller than an inductance value of another inductor of the plurality of inductors, a high-frequency transmission signal having leaked from the power amplifier circuit can be inhibited from propagating into the branching circuit through the plurality of inductors. Thus, the high-frequency transmission signal having leaked from the power amplifier circuit is inhibited from having an effect on a reception signal, and the reception sensitivity of the high-frequency module can be increased further.

Furthermore, inductance values of the plurality of inductors may be identical.

Thus, the inductance values of the plurality of inductors can be reduced in a balanced manner, the inductance value of the first inductor is reduced, and a high-frequency transmission signal having leaked from the power amplifier circuit can be inhibited from having an effect on a reception signal from the branching circuit through the plurality of inductors. Hence, the reception sensitivity of the high-frequency module can be increased further.

The present disclosure can provide the high-frequency module that reduces leakage of a high-frequency transmission signal from the power amplifier circuit to the branching circuit and is excellent in reception sensitivity.

DETAILED DESCRIPTION OF THE DISCLOSURE

Figure 1:
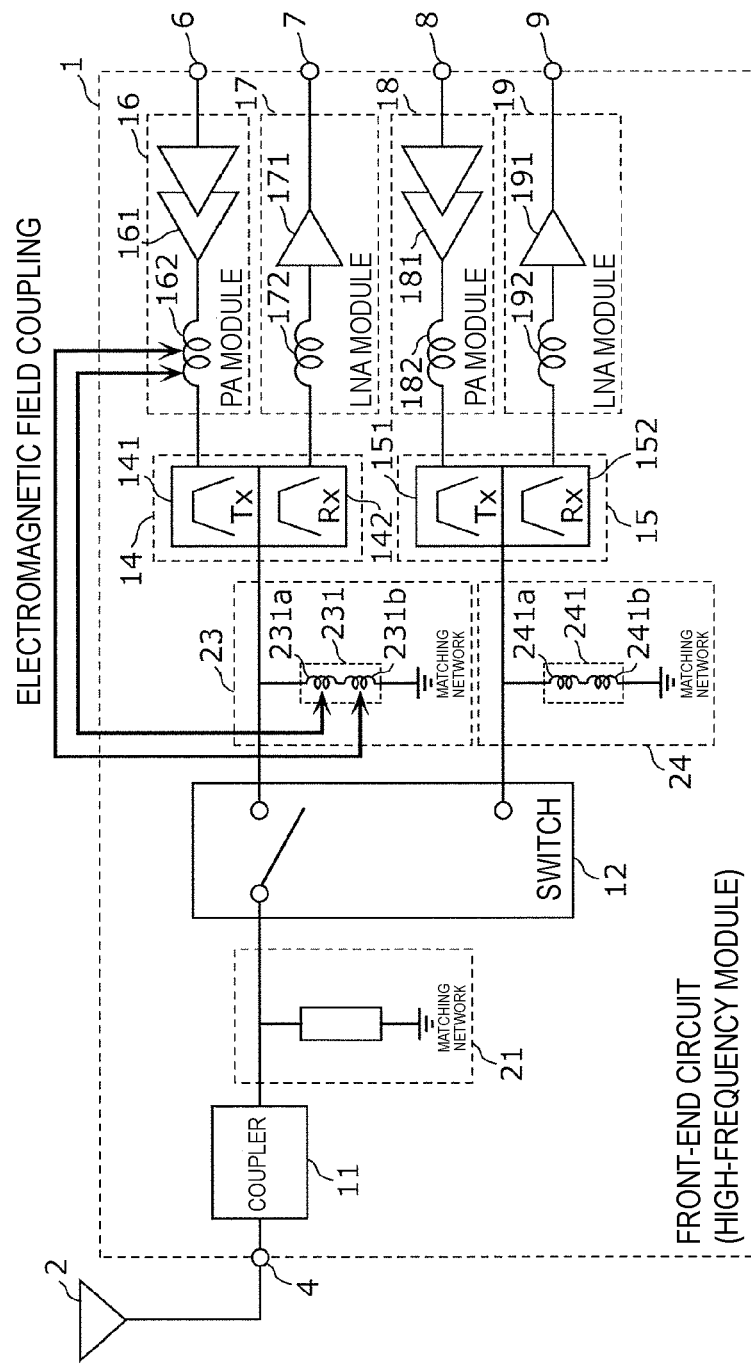
FIG. 1 is a schematic configuration diagram illustrating an example of a configuration of a front-end circuit, which is a high-frequency module according to an embodiment.

Embodiments of the present disclosure will be described below. Note that each of the embodiments described below describes a specific exemplary example of the present disclosure. Hence, numerical values, shapes, materials, components, the arrangement and connection configuration of the components, and so forth that are described in the following embodiments are merely examples and are not intended to limit the present disclosure. Thus, among the components in the following embodiment, a component not described in an independent claim representing the most generic concept of the present disclosure is described as an optional component.

Furthermore, each of the figures is a schematic diagram and is not necessarily drawn precisely. In the figures, components that are substantially the same are denoted by the same reference numerals, and a repeated description thereof is omitted or simplified.

First Embodiment

A first embodiment will be described below with reference to FIGS. 1 to 5. In this embodiment, as a high-frequency module, a front-end circuit used in a communication device will be described as an example.

First, a configuration of a front-end circuit 1, which is a high-frequency module according to this embodiment, will be described. FIG. 1 is a schematic configuration diagram illustrating an example of a configuration of the front-end circuit 1 according to this embodiment.

1. Configuration of Front-End Circuit

The front-end circuit 1 is a high-frequency module that performs filtering on an amplified high-frequency signal, switching between a transmission signal to be transmitted to a receiver and a reception signal received from the receiver, and so forth. A high-frequency signal outputted from the front-end circuit 1 is transmitted from an antenna 2 to a base station. In this embodiment, the front-end circuit 1 is used in a communication device that transmits and receives high-frequency signals in transmission bands and reception bands, for example, of Band 8 and Band 26.

The front-end circuit 1 includes input-output terminals 4, 6, 7, 8, and 9. The input-output terminal 4 is an antenna terminal connected to the antenna 2. The input-output terminals 6, 7, 8, and 9 are connected to an RF signal processing circuit (RFIC) to be described.

The input-output terminal 6 is a terminal that inputs a high-frequency signal in a transmission band, for example, of Band 26 (814 MHz to 849 MHz) to the front-end circuit 1.

The input-output terminal 7 is a terminal that outputs a high-frequency signal in a reception band, for example, of Band 26 (859 MHz to 894 MHz) from the front-end circuit 1 to a high-frequency circuit provided at a subsequent stage.

The input-output terminal 8 is a terminal that inputs a high-frequency signal in a transmission band, for example, of Band 8 (880 MHz to 915 MHz) to the front-end circuit 1.

The input-output terminal 9 is a terminal that outputs a high-frequency signal in a reception band, for example, of Band 8 (925 MHz to 960 MHz) from the front-end circuit 1 to the high-frequency circuit provided at the subsequent stage.

As illustrated in FIG. 1, the front-end circuit 1 includes a coupler 11, a switch 12, duplexers 14 and 15, PA modules 16 and 18, LNA modules 17 and 19, and matching networks 21, 23, and 24.

The coupler 11 is connected to the input-output terminal 4 and is a directional coupler that divides a high-frequency signal received by the antenna 2 between different systems and monitors power of the high-frequency signal.

The matching network 21 is a circuit for performing input/output impedance matching. The matching network 21 is constituted, for example, by a capacitor or inductor. The matching network 21 is provided between the coupler 11 and the switch 12 and matches input/output impedance on a coupler 11 side to input/output impedance on a switch 12 side.

The switch 12 is a switching switch for transmitting transmission/reception signals in Band 26 and Band 8 to different paths. When the switch 12 is switched, a transmission/reception signal in Band 26 passes through the matching network 23 and the duplexer 14. Furthermore, a transmission/reception signal in Band 8 passes through the matching network 24 and the duplexer 15. The switch 12 may be constituted, for example, by a semiconductor switching circuit, or by a switch that is physically switched.

The matching network 23 is connected between the switch 12 and the duplexer 14 and is a circuit for matching input/output impedance on the switch 12 side to input/output impedance on a duplexer 14 side. As in the matching network 21, the matching network 23 is constituted, for example, by a capacitor or inductor.

Similarly, the matching network 24 is connected between the switch 12 and the duplexer 15 and is a circuit for matching input/output impedance on the switch 12 side to input/output impedance on a duplexer 15 side. As in the matching networks 21 and 23, the matching network 24 is constituted, for example, by a capacitor or inductor. Configurations of the matching networks 23 and 24 will be described in detail later.

The duplexer 14 and the duplexer 15 correspond to a branching circuit used for electrically isolating a transmission path and a reception path from each other. The duplexer 14 and the duplexer 15 are electrically connected to the input-output terminal 4 through the coupler 11, the matching network 21, and the switch 12.

As illustrated in FIG. 1, the duplexer 14 includes a transmission filter 141 and a reception filter 142. For example, the transmission filter 141 is a band pass filter that passes a signal in a frequency band of a transmission signal in Band 26. Similarly, the reception filter 142 is a band pass filter that passes a signal in a high-frequency band of a reception signal in Band 26.

Similarly, the duplexer 15 includes a transmission filter 151 and a reception filter 152. For example, the transmission filter 151 is a band pass filter that passes a signal in a high-frequency band of a transmission signal in Band 8. Similarly, the reception filter 152 is a band pass filter that passes a signal in a frequency band of a reception signal in Band 8.

The duplexer 14 is connected to signal paths (a transmission path and a reception path) for transmitting and receiving high-frequency signals in Band 26. The duplexer 15 is connected to signal paths (a transmission path and a reception path) for transmitting and receiving high-frequency signals in Band 8. That is, the branching circuit is connected to a plurality of signal paths for transmitting and receiving high-frequency signals in a plurality of communication bands (Band 26 and Band 8).

The switch 12 switches between the connection of signal paths for transmitting and receiving high-frequency signals in Band 26 to the input-output terminal 4 and the connection of signal paths for transmitting and receiving high-frequency signals in Band 8 to the input-output terminal 4.

The matching network 23 is connected between the switch 12 and the branching circuit constituted by the duplexers 14 and 15 and performs impedance matching between the switch 12 and the branching circuit.

The PA module 16 includes a PA (Power Amp) 161 and an inductor 162. The PA module 16 is electrically connected to the duplexer 14. More specifically, the PA module 16 is connected to the transmission filter 141 of the duplexer 14.

The PA 161 is a power amplifier circuit that amplifies a high-frequency transmission signal and outputs the amplified high-frequency signal to the transmission filter 141 of the duplexer 14, and constitutes a transmission circuit. The inductor 162 is a second inductor connected in series with the PA 161 between the PA 161 and the transmission filter 141, and constitutes a second matching network. The second matching network constituted by the inductor 162 is an output matching network that performs impedance matching between an output terminal of the PA 161 and the duplexer 14. An amplifier element provided in the PA 161 may be, for example, a transistor, such as an HBT (Heterojunction Bipolar Transistor). Furthermore, the inductor 162 may be a chip inductor, or may be an inductor built into a substrate 30 (see FIG. 3) to be described. The inductor 162 may be connected between a path between the PA 161 and the transmission filter 141 and a ground.

Similarly, the PA module 18 includes a PA 181 and an inductor 182. The PA module 18 is electrically connected to the duplexer 15. More specifically, the PA module 18 is connected to the transmission filter 151 of the duplexer 15.

The PA 181 is a power amplifier circuit that amplifies a high-frequency transmission signal and outputs the amplified high-frequency signal to the transmission filter 151 of the duplexer 15, and constitutes a transmission circuit. The inductor 182 is a second inductor connected in series with the PA 181 between the PA 181 and the transmission filter 151, and constitutes a second matching network. The second matching network constituted by the inductor 182 is an output matching network that performs impedance matching between an output terminal of the PA 181 and the duplexer 15. As in the amplifier element provided in the PA 161, an amplifier element provided in the PA 181 may be, for example, a transistor, such as an HBT. The inductor 182 may be a chip inductor, or may be an inductor built into the substrate 30. The inductor 182 may be connected between a path between the PA 181 and the transmission filter 151 and the ground.

The LNA module 17 is a reception circuit electrically connected to the duplexer 14. As illustrated in FIG. 1, the LNA module 17 includes an LNA (Low Noise Amp) 171 including an amplifier element, and an inductor 172. The LNA 171 is a low noise amplifier circuit that amplifies a high-frequency reception signal having passed through the reception filter 142 and outputs the amplified high-frequency signal to the input-output terminal 7. The inductor 172 is connected in series with the LNA 171 between the LNA 171 and the reception filter 142. Incidentally, the inductor 172 may be connected between a path between the LNA 171 and the reception filter 142 and the ground. The amplifier element provided in the LNA 171 may be, for example, a transistor, such as an HBT. Furthermore, the inductor 172 may be a chip inductor, or may be an inductor built into the substrate 30. The LNA module 17 is electrically connected to the duplexer 14. More specifically, the LNA module 17 is connected to the reception filter 142 of the duplexer 14.

Similarly, the LNA module 19 is a reception circuit electrically connected to the duplexer 15. As illustrated in FIG. 1, the LNA module 19 includes an LNA 191 including an amplifier element, and an inductor 192. The LNA 191 is a low noise amplifier circuit that amplifies a high-frequency reception signal having passed through the reception filter 152 and outputs the amplified high-frequency signal to the input-output terminal 9. The inductor 192 is connected in series with the LNA 191 between the LNA 191 and the reception filter 152. Incidentally, the inductor 192 may be connected between a path between the LNA 191 and the reception filter 152 and the ground. The amplifier element provided in the LNA 191 may be, for example, a transistor, such as an HBT. Furthermore, the inductor 192 may be a chip inductor, or may be an inductor built into the substrate 30. The LNA module 19 is electrically connected to the duplexer 15. More specifically, the LNA module 19 is connected to the reception filter 152 of the duplexer 15.

In this embodiment, each of the PAs 161 and 181 is a power amplifier circuit, and each of the inductors 162 and 182 is a second inductor.

2. Configuration of Matching Network

Here, with respect to configurations of the matching network 23 and the matching network 24, the matching network 23 will be described as an example.

Figure 2:
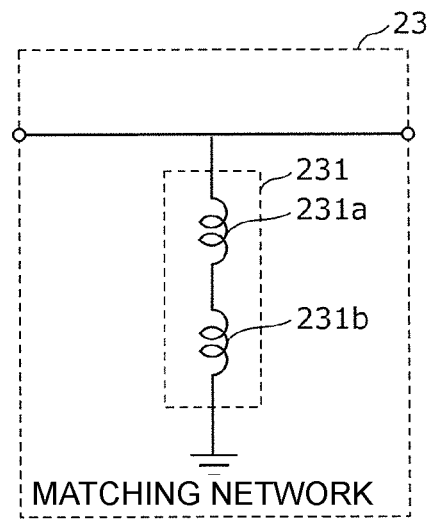
FIG. 2 is a circuit diagram of a matching network of the front-end circuit, which is the high-frequency module according to the embodiment.

FIG. 2 is a circuit diagram of the matching network 23 of the front-end circuit 1 according to this embodiment. As illustrated in FIG. 2, the matching network 23 includes an inductor 231. The inductor 231 is connected between a node connecting the switch 12 and the duplexer 14 and the ground. In this embodiment, the inductor 231 is a first inductor.

The inductor 231 includes two inductors 231a and 231b connected in series. In this embodiment, the inductors 231a and 231b are a plurality of inductors. Each of the inductors 231a and 231b is, for example, a chip inductor. For example, each of the inductors 231a and 231b may be a chip inductor of a winding structure type in which a coil is formed by winding a copper wire on a core of alumina or the like. Furthermore, each of the inductors 231a and 231b may be a chip inductor of a laminated structure type in which a conductor constituting a coil, and a ceramic material are stacked and integrated.

The inductors 231a and 231b are disposed so that directions of axes of the inductors 231a and 231b disposed on the substrate 30 (see FIG. 3) are parallel to the substrate 30. Incidentally, a direction of an axis of an inductor refers to a direction in which an axis passing through a center of a coil formed as the inductor extends. The inductors 231a and 231b are coupled, via an electromagnetic field, to the inductor 162 provided in the PA module 16.

An inductance value of the inductor 231a and an inductance value of the inductor 231b are identical, for example. That is, each of the inductance value of the inductor 231a and the inductance value of the inductor 231b is half an inductance value in the case where the inductor 231 is constituted by one inductor.

Each of the inductors 231a and 231b may be a chip inductor, or may be an inductor formed by a metal pattern on a surface of the substrate 30. Furthermore, each of the inductors 231a and 231b may be an inductor at least part of which is built into the substrate 30.

Furthermore, the inductance value of the inductor 231a and the inductance value of the inductor 231b are not limited to being identical, and may be different.

The matching network 23 is not limited to including only the inductor 231 and may include another inductor or a capacitor. At this time, an inductor other than the inductor 231 or a capacitor may be disposed and connected in series with the node connecting the switch 12 and the duplexer 14, or may be connected between the node connecting the switch 12 and the duplexer 14 and the ground. Furthermore, an inductor other than the inductor 231 or a capacitor may be connected in parallel with the inductor 231.

As in the matching network 23, the matching network 24 includes an inductor 241 (see FIG. 1) between a node connecting the switch 12 and the duplexer 15 and the ground. The inductor 241 includes two inductors 241a and 241b connected in series. The inductors 241a and 241b have a configuration similar to that of the inductors 231a and 231b, and a detailed description thereof is therefore omitted.

Figure 3:
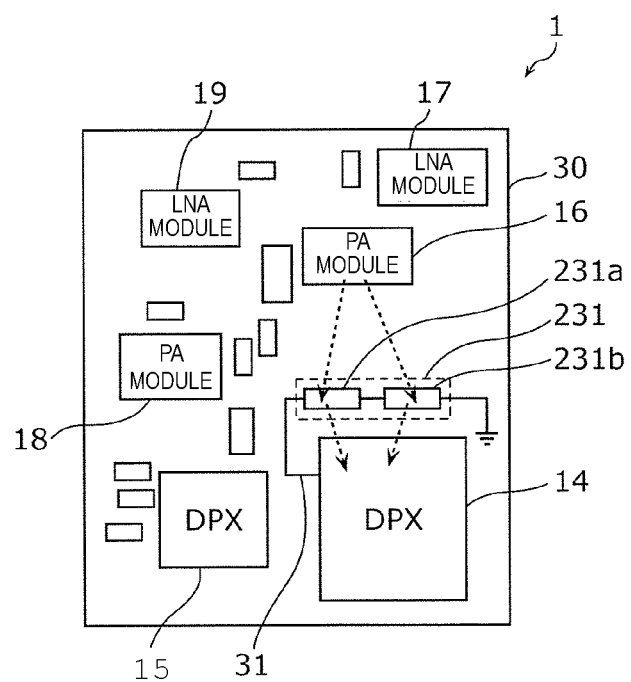
FIG. 3 is a plan view illustrating an example of a layout relationship between components in the front-end circuit, which is the high-frequency module according to the embodiment.

FIG. 3 is a plan view illustrating an example of a layout relationship between components in the front-end circuit 1 according to this embodiment. The front-end circuit 1 includes, for example, the above-described coupler 11, switch 12 (not illustrated), duplexers 14 and 15, PA modules 16 and 18, LNA modules 17 and 19, matching networks 21, 23, and 24, and other components, such as an inductor and a capacitor, that are disposed on the substrate 30. Note that some of lines connecting the switch 12 and each component are not illustrated.

The substrate 30 is, for example, an LTCC (Low Temperature Co-fired Ceramic) substrate, and a laminated ceramic including a plurality of ceramic sheets made of ceramic that are laminated. On the surface of and within the substrate 30, lines are formed by a metal pattern, a via, and so forth as described later.

Here, as illustrated in FIG. 3, the inductors 231a and 231b constituting the inductor 231 of the matching network 23 are disposed between the duplexer 14 and the PA module 16 when the substrate 30 is viewed in plan. Since the inductor 162 of the PA module 16 is coupled to the inductors 231a and 231b via an electromagnetic field, it is assumed that a high-frequency transmission signal amplified by the PA module 16, a harmonic component of the high-frequency transmission signal, or an intermodulation distortion component generated between the high-frequency transmission signal and another high-frequency transmission signal leaks from the inductor 162 (see FIG. 1) provided in the PA module 16 to the inductors 231a and 231b as represented by arrows in FIG. 3, and further bypasses the transmission filter 141 and leaks to the reception filter 142.

Here, in the case where the inductor 231 is constituted by the two inductors 231a and 231b connected in series, the degree of electromagnetic field coupling between the inductor 231 including the inductors 231a and 231b disposed away from each other with a line interposed therebetween and the inductor 162 can be reduced in comparison with the degree of electromagnetic field coupling with the inductor 162 in the case where the inductor 231 is constituted by one inductor in which the number of turns of a winding, a distance between turns of the winding, a winding direction, and so forth are standardized. That is, when a combined inductance value of the inductors 231a and 231b is set to the same inductance value as that of the inductor 231 constituted by one inductor, the effective amount of electromagnetic field coupling between the inductors 231a and 231b and the inductor 162 can be reduced in comparison with the amount of electromagnetic field coupling between the inductor 231 constituted by one inductor and the inductor 162. In other words, leakage of a harmonic component of a high-frequency transmission signal from the inductor 162 to the inductors 231a and 231b is reduced in comparison with the case where the inductor 231 is constituted by one inductor. Thus, a high-frequency transmission signal having leaked from the PA 161 propagates into the reception filter 142 through the inductors 162 and 231 to make it possible to suppress an increase in noise level in the reception circuit (LNA module 17). Hence, the reception sensitivity of the front-end circuit 1 can be increased.

With respect to the PA module 18 and the duplexer 15 as well, leakage of a high-frequency transmission signal from the PA module 18 to the reception filter 152 is reduced as in the PA module 16 and the duplexer 14, and the reception sensitivity of the front-end circuit 1 can be increased.

Incidentally, it can be detected whether two inductors are coupled via an electromagnetic field. For example, it is determined that the two inductors are coupled via an electromagnetic field if there is a change in filter characteristics when an orientation of an inductor is changed, and it is determined that the two inductors are not coupled via an electromagnetic field if there is no change in filter characteristics when an orientation of an inductor is changed.

3. Effects

Thus, in the front-end circuit 1 according to this embodiment, the inductor 231 coupled, via an electromagnetic field, to the inductor 162 connected between the duplexer 14 and the PA 161 is constituted by the plurality of inductors 231a and 231b connected in series.

Thus, a high-frequency transmission signal amplified by the PA module 16 can be inhibited from having an effect on a reception signal from the duplexer 14. Hence, the reception sensitivity of the front-end circuit 1 can be increased. Incidentally, the same holds true for the PA module 18 and the duplexer 15 as in the PA module 16 and the duplexer 14.

The inductance value of the inductor 231a and the inductance value of the inductor 231b are not limited to being identical, and may be different. For example, of the inductors 231a and 231b, the inductance value of the inductor 231a or 231b disposed close to the inductor 162 to be subjected to electromagnetic field coupling may be set to be smaller than the inductance value of the inductor 231b or 231a disposed away from the inductor 162.

The inductance value of the inductor 231a or 231b disposed close to the inductor 162 has a large effect on the strength of electromagnetic field coupling with the inductor 162. Hence, when the inductance value of the inductor 231a or 231b disposed close to the inductor 162 is set to be small, leakage of a harmonic component of a high-frequency transmission signal from the inductor 162 to the inductors 231a and 231b can be reduced further.

Furthermore, the inductor 231 is not limited to being constituted by the two inductors 231a and 231b, and may be constituted by three or more inductors.

Furthermore, each the matching networks 23 and 24 may include another inductor other than the inductor 231 and 241, and a capacitor. In this case, in the matching network 23, another inductor other than the inductor 231 and a capacitor may be connected in series with the node between the switch 12 and the duplexer 14, or may be connected between the node between the switch 12 and the duplexer 14 and the ground. The same holds true for the matching network 24 as in the matching network 23.

Furthermore, not only for the matching networks 23 and 24 but also for the matching network 21, a configuration similar to that of the matching network 23 may be employed. If the matching network 21 includes an inductor, the inductor is coupled, via an electromagnetic field, to the inductor 162 provided in the PA module 16 and the inductor 182 provided in the PA module 18. Hence, when the inductor provided in the matching network 21 is constituted by a plurality of inductors connected in series, the strength of electromagnetic field coupling of the plurality of inductors provided in the matching network 21 to the inductors 162 and 182 can be reduced as in the matching network 23. Thus, in the front-end circuit 1, leakage of a high-frequency transmission signal from a PA module is reduced further, and reception sensitivity can be increased.

(Modification 1)

Figure 4:
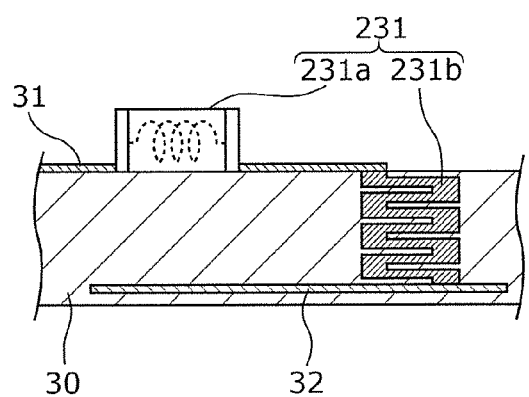
FIG. 4 is a cross-sectional view illustrating a layout relationship between inductors in the matching network of the front-end circuit, which is the high-frequency module according to the embodiment.

Here, Modification 1 of the first embodiment will be described. FIG. 4 is a cross-sectional view illustrating a layout relationship between the inductors 231a and 231b in the matching network 23 of the front-end circuit 1, which is the high-frequency module according to this embodiment.

In the front-end circuit 1, each of the inductors 231a and 231b may be constituted by a chip inductor as described above, but is not limited to a chip inductor and may be constituted by an inductor built into the substrate 30. Furthermore, part of the inductor 231 may be built into the substrate 30. For example, one of the inductors 231a and 231b may be constituted by a chip inductor, and the other may be constituted by an inductor built into the substrate 30.

As illustrated in FIG. 4, in the substrate 30, the inductor 231a is constituted by a chip inductor. The inductor 231a is disposed on the surface of the substrate 30 so that, for example, a direction of an axis of the inductor 231a is parallel to the substrate 30. The inductor 231a is electrically connected to a line 31 formed on the substrate 30. Furthermore, the line 31 is electrically connected to the duplexer 14 (see FIG. 3).

Furthermore, as illustrated in FIG. 4, the inductor 231b is formed within the substrate 30. When the substrate 30 is viewed in perspective from an upper surface thereof, for example, the inductor 231b takes on a shape in which wiring patterns formed in layers of the substrate 30 of a laminated structure are wound in a spiral fashion. Incidentally, in FIG. 4, a configuration of the inductor 231b is illustrated in a simplified manner to facilitate understanding of a layout relationship between the inductors 231a and 231b.

Furthermore, a conductor 32 is provided within the substrate 30. The conductor 32 is connected to the ground. The inductor 231b is formed between the line 31 to which the inductor 231a is connected and the conductor 32. At this time, the inductor 231b is formed so that, for example, a direction of an axis of the inductor 231b is a direction perpendicular to the surface of the substrate 30.

The direction of the axis of the inductor 231b is not limited to the direction perpendicular to the surface of the substrate 30. The inductor 231b may be formed within the substrate 30 so that the direction of the axis of the inductor 231b is a direction parallel to the surface of the substrate 30.

Thus, the inductor 231 is constituted by the inductor 231a surface-mounted on the substrate 30 and the inductor 231b built into the substrate 30. Hence, the sum of the amount of coupling between the inductor 231a and the inductor 162 and the amount of coupling between the inductor 231b and the inductor 162 can be reduced in comparison with the amount of electromagnetic field coupling between the inductor 231 constituted by one inductor in which a Q value, the number of turns of a winding, a distance between turns of the winding, a winding direction, and so forth are standardized and the inductor 162. That is, when a combined inductance value of the inductors 231a and 231b is set to the same inductance value as that of the inductor 231 constituted by one inductor, the effective amount of electromagnetic field coupling between the inductors 231a and 231b and the inductor 162 can be reduced in comparison with the amount of electromagnetic field coupling between the inductor 231 constituted by one inductor and the inductor 162. In other words, the sum of the amounts of leakage of a harmonic component of a high-frequency transmission signal from the inductor 162 to the respective inductors 231a and 231b is reduced in comparison with the case where the inductor 231 is constituted by one inductor.

Hence, a high-frequency transmission signal having leaked from the PA 161 propagates into the reception filter 142 through the inductors 162 and 231 and thereby can be inhibited from having an adverse effect on a reception signal in the LNA module 17. As a result, the reception sensitivity of the front-end circuit 1 can be increased. Furthermore, since the inductor 231b is a substrate built-in type inductor, the numbers of components and lines that are disposed on the substrate 30 can be reduced, and the front-end circuit 1 can thus be miniaturized. Furthermore, high-frequency signal interference is inhibited from occurring between wiring patterns, and the reception sensitivity of the front-end circuit 1 can be increased further.

Thus, the front-end circuit 1 reduces leakage of a high-frequency transmission signal from a PA module further, and can increase reception sensitivity. Furthermore, when the inductor 231b is formed within the substrate 30, the number of circuit components disposed on the surface of the substrate 30 can be reduced, and the front-end circuit 1 can thus be miniaturized.

(Modification 2)

Figure 5:
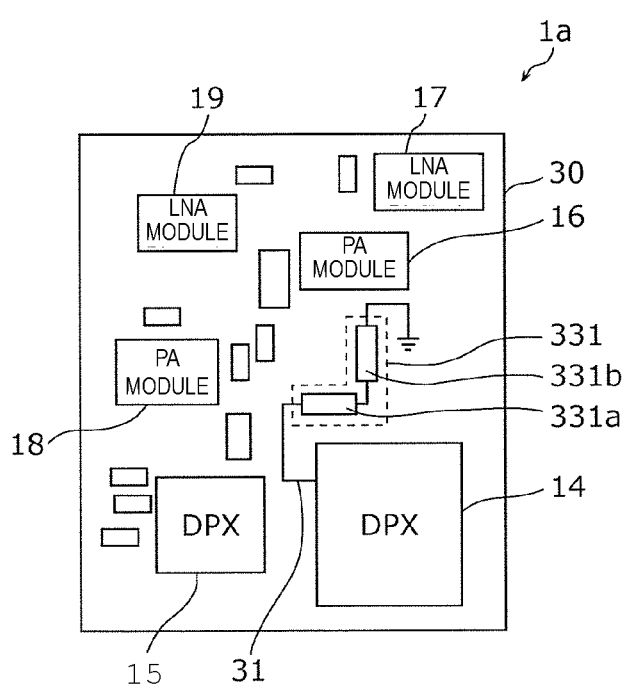
FIG. 5 is a plan view illustrating another example of a layout relationship between components in a front-end circuit, which is a high-frequency module according to the embodiment.

Furthermore, Modification 2 of the first embodiment will be described. FIG. 5 is a plan view illustrating another example of a layout relationship between components in a front-end circuit 1a, which is a high-frequency module according to this modification.

In the front-end circuit 1a according to this modification, inductors 331a and 331b constituting an inductor 331 of the matching network 23 are disposed on the substrate 30 so that directions of axes of the inductors 331a and 331b intersect each other at right angles when the substrate 30 is viewed in plan.

Specifically, in the front-end circuit 1a, the matching network 23 includes the inductor 331. The inductor 331 is connected between the node connecting the switch 12 and the duplexer 14 and the ground. The inductor 331 includes two inductors 331a and 331b connected in series.

Furthermore, as illustrated in FIG. 5, in the substrate 30, the inductors 331a and 331b are disposed between the duplexer 14 and the PA module 16. The inductors 331a and 331b are connected in series with the line 31 that connects the node connecting the switch 12 and the duplexer 14 and the ground.

Furthermore, as illustrated in FIG. 5, the inductors 331a and 331b are disposed on the substrate 30 so that the directions of the axes of the inductors 331a and 331b are parallel to the substrate 30 and intersect each other at right angles when the substrate 30 is viewed in plan. This inhibits the inductors 331a and 331b from being coupled via an electromagnetic field and suppresses an increase in an inductance value of the inductor 331.

A direction of an axis of an inductor refers to a direction in which a central axis of a coil formed as the inductor extends. In the above-described configuration, the directions of the axes of the two inductors 331a and 331b constituting the inductor 331 intersect each other at right angles, and thus the sum of the amount of coupling between the inductor 331a and the inductor 162 and the amount of coupling between the inductor 331b and the inductor 162 can be reduced in comparison with the amount of electromagnetic field coupling between the inductor 331 constituted by one inductor in which the number of turns of a winding, a distance between turns of the winding, a winding direction, and so forth are standardized and the inductor 162. That is, when a combined inductance value of the inductors 331a and 331b is set to the same inductance value as that of the inductor 331 constituted by one inductor, the effective amount of electromagnetic field coupling between the inductors 331a and 331b and the inductor 162 can be reduced in comparison with the amount of electromagnetic field coupling between the inductor 331 constituted by one inductor and the inductor 162. In other words, the sum of the amounts of leakage of a harmonic component of a high-frequency transmission signal from the inductor 162 to the respective inductors 331a and 331b is reduced in comparison with the case where the inductor 331 is constituted by one inductor.

Hence, a high-frequency transmission signal having leaked from the PA 161 propagates into the reception filter 142 through the inductors 162 and 331 and thereby can be inhibited from having an adverse effect on a reception signal in the LNA module 17. As a result, the reception sensitivity of the front-end circuit 1a can be increased.

Although, in this modification, the disposition is made so that the directions of the axes of the inductors 331a and 331b intersect each other at right angles when the substrate 30 is viewed in plan, the directions of the axes of the inductors 331a and 331b only have to intersect each other.

On this basis, the directions of the axes of the two inductors 331a and 331b constituting the inductor 331 intersect each other, and thus the sum of the amount of coupling between the inductor 331a and the inductor 162 and the amount of coupling between the inductor 331b and the inductor 162 can be reduced in comparison with the amount of electromagnetic field coupling between the inductor 331 constituted by one inductor in which the number of turns of a winding, a distance between turns of the winding, a winding direction, and so forth are standardized and the inductor 162. Hence, a high-frequency transmission signal having leaked from the PA 161 propagates into the reception filter 142 through the inductors 162 and 331 and thereby can be inhibited from having an adverse effect on a reception signal in the LNA module 17. As a result, the reception sensitivity of the front-end circuit 1a can be increased.

Furthermore, with respect to inductance values of the inductors 331a and 331b, an inductance value of the inductor 331b disposed close to the PA module 16 including the inductor 162 may be set to be smaller than that of the inductor 331a. When the inductance value of the inductor 331b disposed close to the PA module 16 including the inductor 162 to be subjected to electromagnetic field coupling with the inductors 331a and 331b is set to be smaller than an inductance value of the inductor 331a, leakage of a harmonic component of a high-frequency transmission signal from the inductor 162 to the inductor 331b can be reduced further.

Thus, an effect that a high-frequency transmission signal amplified by the PA module 16 has on a reception signal from the duplexer 14 is reduced further, and loss of the high-frequency transmission signal can be reduced further.

Second Embodiment

Figure 6:
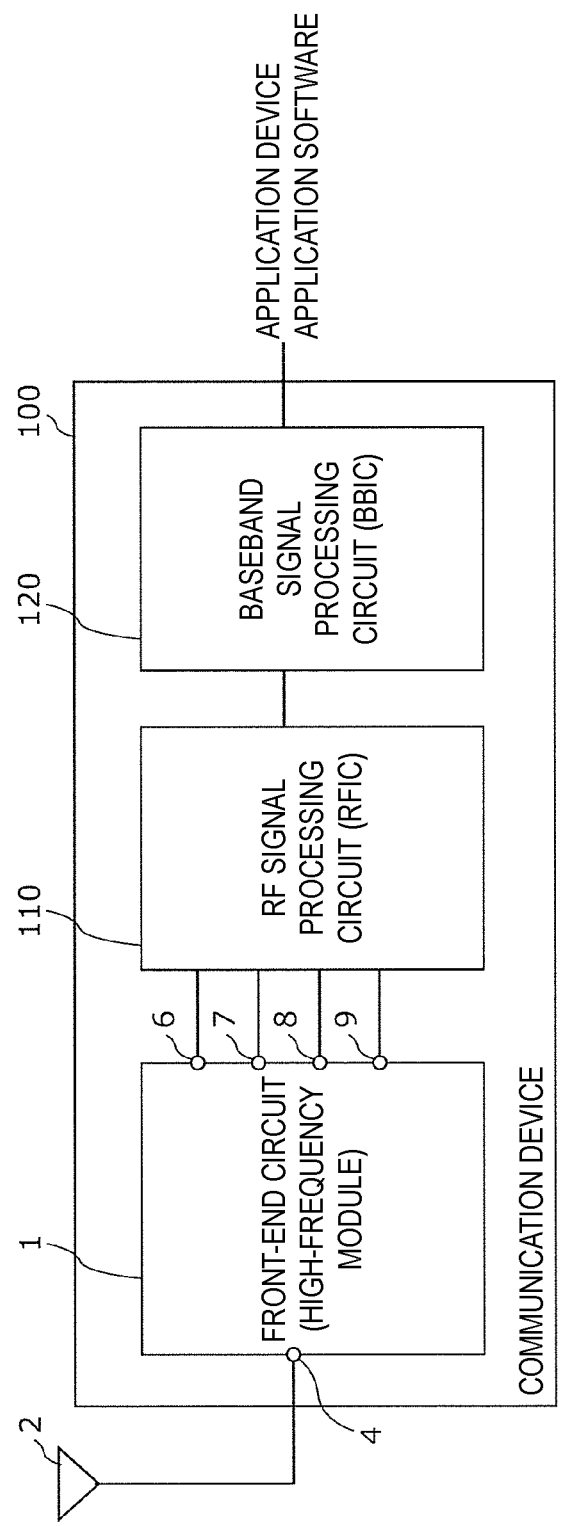
FIG. 6 is a schematic configuration diagram illustrating a configuration of a communication device according to an embodiment.

The front-end circuit 1 described in the first embodiment may be used as the front-end circuit 1 of a communication device as described below. FIG. 6 is a schematic configuration diagram illustrating a configuration of a communication device 100 according to this embodiment.

As illustrated in FIG. 6, the communication device 100 includes the front-end circuit 1, an RF signal processing circuit (RFIC) 110, and a baseband signal processing circuit (BBIC) 120.

In the communication device 100, the input-output terminal 4 of the front-end circuit 1 is connected to the antenna 2 as described in the first embodiment. Furthermore, the input-output terminals 6, 7, 8, and 9 of the front-end circuit 1 are connected to the RF signal processing circuit 110 provided at a subsequent stage. The RF signal processing circuit 110 is connected to the baseband signal processing circuit 120 provided at a subsequent stage. Furthermore, the baseband signal processing circuit 120 is connected to another application device, application software, or the like.

The RF signal processing circuit 110 converts a transmission signal received from the baseband signal processing circuit 120 into a transmission RF signal and supplies the transmission RF signal to the front-end circuit 1. The conversion may include the modulation and up-conversion of a signal. Furthermore, the RF signal processing circuit 110 converts a reception RF signal received from the front-end circuit 1 into a reception signal and supplies the reception signal to the baseband signal processing circuit 120. The conversion may include demodulation and down-conversion of a signal. The RF signal processing circuit 110 may be constituted by an RFIC chip.

The baseband signal processing circuit 120 converts, into a transmission signal, transmission data generated by the application device/application software that provides a voice call, an image display, and so forth, and supplies the transmission signal to the RF signal processing circuit 110. The conversion may include data compression, data multiplexing, and addition of an error correction code. Furthermore, the baseband signal processing circuit 120 converts the reception signal received from the RF signal processing circuit 110 into reception data and supplies the reception data to the application device/application software. The conversion may include data decompression, data demultiplexing, and error correction. The baseband signal processing circuit 120 may be constituted by a BBIC chip.

The communication device 100 allows a communication device that reduces leakage of power of a high-frequency transmission signal and whose reception sensitivity is increased to be obtained by using the front-end circuit 1 that reduces leakage of power of a high-frequency transmission signal from a PA module and whose reception sensitivity is increased. Furthermore, a harmonic component (spurious component) emitted from the antenna 2 to outside the communication device 100 can be reduced.

OTHER EMBODIMENTS

The present disclosure is not limited to the configurations described in the above-described embodiments, and a change may be appropriately made to the present disclosure.

For example, each of the inductors 231a and 231b may be constituted by a chip inductor, or may be constituted by an inductor built into the substrate 30. Furthermore, one of the inductors 231a and 231b may be constituted by a chip inductor, and the other may be constituted by an inductor built into the substrate 30.

Furthermore, the inductors 331a and 331b may be disposed on the substrate 30 so that the directions of the axes of the inductors 331a and 331b intersect each other at right angles when the substrate 30 is viewed in plan.

Furthermore, the inductance value of the inductor 231a and the inductance value of the inductor 231b are not limited to being identical, and may be different.

Furthermore, of the inductors 231a and 231b, the inductance value of the inductor 231a or 231b disposed close to the inductor 162 to be subjected to electromagnetic field coupling may be set to be smaller than the inductance value of the inductor 231b or 231a disposed away from the inductor 162.

Furthermore, the inductor 231 is not limited to being constituted by the two inductors 231a and 231b, and may be constituted by three or more inductors.

Furthermore, the inductor 162 is not limited to being connected in series with the PA 161 between the PA 161 and the transmission filter 141, and may be connected between a path between the PA 161 and the transmission filter 141 and the ground.

Furthermore, each the matching networks 23 and 24 may include another inductor other than the inductor 231 and 241, and a capacitor. In this case, in the matching network 23, another inductor other than the inductor 231 and a capacitor may be connected in series with the node between the switch 12 and the duplexer 14, or may be connected between the node between the switch 12 and the duplexer 14 and the ground.

Furthermore, not only for the matching networks 23 and 24 but also for the matching network 21, a configuration similar to that of the matching network 23 may be employed.

In addition, embodiments obtained by making various modifications conceived by a person skilled in the art to the above-described embodiments, or embodiments implemented by combining any components and any functions in the above-described embodiments without departing from the gist of the present disclosure may also be included in the scope of an aspect of the present disclosure.

The present disclosure can be used for a high-frequency module, a transmission device, a reception device, a communication device including these, and so forth for which high integration and miniaturization are necessary.

1, 1a front-end circuit (high-frequency module)
2 antenna
4 input-output terminal (antenna terminal)
6, 7, 8, 9 input-output terminal
11 coupler
12 switch
14, 15 duplexer (branching circuit)
16, 18 PA module
17, 19 LNA module
21, 23, 24 matching network
30 substrate
31 line
32 conductor
100 communication device
110 RF signal processing circuit
120 baseband signal processing circuit
141, 151 transmission filter
142, 152 reception filter
161, 181 PA (power amplifier circuit)
162, 182 inductor (second inductor)
171, 191 LNA
231, 241, 331 inductor (first inductor)
231a, 231b, 241a, 241b, 331a, 331b inductor (a plurality of inductors)

The invention claimed is:

1. A high-frequency module comprising:
an antenna terminal;
a branching circuit electrically connected to the antenna terminal;
a reception circuit electrically connected to the branching circuit;
a transmission circuit electrically connected to the branching circuit, the transmission circuit including a power amplifier circuit;
a first matching network provided between the antenna terminal and the branching circuit, the first matching network including a first inductor; and
a second matching network provided between the branching circuit and the power amplifier circuit, the second matching network including a second inductor,
wherein the second matching network is an output matching network configured to perform impedance matching between an output terminal of the power amplifier circuit and the branching circuit,
wherein the first inductor includes a third inductor and a fourth inductor connected in series, and
wherein no elements are connected between a node on a path connecting the third inductor and the fourth inductor and ground.

2. The high-frequency module according to claim 1, wherein the first inductor and the second inductor are coupled via an electromagnetic field.

3. The high-frequency module according to claim 1, wherein the branching circuit is connected to a plurality of signal paths for transmitting and receiving high-frequency signals in a plurality of communication bands,
wherein the high-frequency module includes a switch configured to switch between the plurality of signal paths, and
wherein the first matching network is connected between the switch and the branching circuit, and performs impedance matching between the switch and the branching circuit.

4. The high-frequency module according to claim 1, wherein the first inductor is connected between a node between the antenna terminal and the branching circuit and a ground.

5. The high-frequency module according to claim 2,
wherein the first inductor is connected between a node between the antenna terminal and the branching circuit and a ground.

6. The high-frequency module according to claim 3,
wherein the first inductor is connected between a node between the antenna terminal and the branching circuit and a ground.

7. A high-frequency module comprising:
an antenna terminal;
a branching circuit electrically connected to the antenna terminal;
a reception circuit electrically connected to the branching circuit;
a transmission circuit electrically connected to the branching circuit, the transmission circuit including a power amplifier circuit;
a first matching network provided between the antenna terminal and the branching circuit, the first matching network including a first inductor; and
a second matching network provided between the branching circuit and the power amplifier circuit, the second matching network including a second inductor,
wherein the second matching network is an output matching network configured to perform impedance matching between an output terminal of the power amplifier circuit and the branching circuit,
wherein the first inductor includes a plurality of inductors connected in series, and
wherein at least two of the plurality of inductors are disposed on a substrate so that directions of axes of at least two of the plurality of inductors intersect each other when viewed in plan.

8. The high-frequency module according to claim 2,
wherein the third inductor and the fourth inductor are disposed on a substrate so that directions of axes of the third inductor and the fourth inductor intersect each other when viewed in plan.

9. The high-frequency module according to claim 3,
wherein the third inductor and the fourth inductor are disposed on a substrate so that directions of axes of the third inductor and the fourth inductor intersect each other when viewed in plan.

10. A high-frequency module comprising:
an antenna terminal;
a branching circuit electrically connected to the antenna terminal;
a reception circuit electrically connected to the branching circuit;
a transmission circuit electrically connected to the branching circuit, the transmission circuit including a power amplifier circuit;
a first matching network provided between the antenna terminal and the branching circuit, the first matching network including a first inductor; and
a second matching network provided between the branching circuit and the power amplifier circuit, the second matching network including a second inductor,
wherein the second matching network is an output matching network configured to perform impedance matching between an output terminal of the power amplifier circuit and the branching circuit,
wherein the first inductor includes a plurality of inductors connected in series, and
wherein at least two of the plurality of inductors are disposed on a substrate so that directions of axes of at least two of the plurality of inductors intersect are parallel to the substrate.

11. The high-frequency module according to claim 7,
wherein at least two of the plurality of inductors are disposed on the substrate so that directions of axes of at least two of the plurality of inductors intersect each other at right angles when viewed in plan.

12. The high-frequency module according to claim 1,
wherein one inductor of the third inductor and the fourth inductor is a chip inductor, and
wherein another inductor of the third inductor and the fourth inductor is built into a substrate.

13. The high-frequency module according to claim 2,
wherein one inductor of the third inductor or the fourth inductor is a chip inductor, and
wherein another inductor of the third inductor or the fourth inductor is built into a substrate.

14. The high-frequency module according to claim 3,
wherein one inductor of the third inductor or the fourth inductor is a chip inductor, and
wherein another inductor of the third inductor or the fourth inductor is built into a substrate.

15. The high-frequency module according to claim 1,
wherein, of the third inductor and the fourth inductor, an inductance value of an inductor disposed closest to the second inductor is smaller than an inductance value of at least one inductor of the third inductor and the fourth inductor other than the inductor disposed closest to the second inductor.

16. The high-frequency module according to claim 2,
wherein, of the third inductor and the fourth inductor, an inductance value of an inductor disposed closest to the second inductor is smaller than the inductance values of at least one inductor of the third inductor and the fourth inductor other than the inductor disposed closest to the second inductor.

17. The high-frequency module according to claim 3,
wherein, of the third inductor and the fourth inductor, an inductance value of an inductor disposed closest to the second inductor is smaller than the inductance values of at least one inductor of the third inductor and the fourth inductor other than the inductor disposed closest to the second inductor.

18. The high-frequency module according to claim 1,
wherein inductance values of the third inductor and the fourth inductor are identical.

19. The high-frequency module according to claim 2,
wherein inductance values of the third inductor and the fourth inductor are identical.

20. The high-frequency module according to claim 3,
wherein inductance values of the third inductor and the fourth inductor are identical.

* * * * *